(12) United States Patent
Honma et al.

(10) Patent No.: US 7,508,704 B2
(45) Date of Patent: Mar. 24, 2009

(54) NON-VOLATILE SEMICONDUCTOR STORAGE SYSTEM

(75) Inventors: Mitsuaki Honma, Yokohama (JP); Noboru Shibata, Kawasaki (JP); Hironori Uchikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 11/772,563

(22) Filed: Jul. 2, 2007

(65) Prior Publication Data
US 2008/0123408 A1 May 29, 2008

(30) Foreign Application Priority Data
Jul. 4, 2006 (JP) ............... 2006-184362

(51) Int. Cl.
*G11C 11/34* (2006.01)
(52) U.S. Cl. ............... 365/185.03; 365/185.09; 365/185.33; 365/185.19; 365/185.02
(58) Field of Classification Search ............ 365/185.33, 365/185, 185.02, 185.19, 185.093
See application file for complete search history.

(56) References Cited

U.S. PATENT DOCUMENTS

| | | | |
|---|---|---|---|
| 5,768,188 A * | 6/1998 | Park et al. | ............... 365/185.03 |
| 6,594,169 B2 | 7/2003 | Sakui | |
| 6,657,891 B1 * | 12/2003 | Shibata et al. | ......... 365/185.03 |
| 6,925,004 B2 * | 8/2005 | Shibata et al. | ......... 365/185.03 |
| 6,954,380 B2 | 10/2005 | Ono et al. | |

FOREIGN PATENT DOCUMENTS

| | | |
|---|---|---|
| JP | 08-279295 | 10/1996 |
| JP | 2002-251884 | 9/2002 |
| JP | 2005-063516 | 3/2005 |

OTHER PUBLICATIONS

U.S. Appl. No. 11/772,563, filed Jul. 2, 2007, Honma et al.
U.S. Appl. No. 11/877,287, filed Oct. 23, 2007, Uchikawa et al.

* cited by examiner

*Primary Examiner*—Lun-Yi Lao
*Assistant Examiner*—Thao Bui
(74) *Attorney, Agent, or Firm*—Oblon, Spivak, McClelland, Maier & Neustadt, P.C.

(57) ABSTRACT

In a memory cell array, memory cells enabled to store plural-bit data are arranged in matrix. The bit-line control circuit is connected to bit-lines to control the bit-lines. A word line control circuit applies a plural-bit data read voltage as a word line voltage to the word line. The plural-bit data read voltage is larger than an upper limit of one of plural threshold voltage distributions and smaller than a lower limit of another threshold voltage distribution. Furthermore, it applies a soft-value read voltage as a word line voltage to the word line. The soft-value read voltage is smaller than an upper limit of a threshold voltage distribution and larger than a lower limit thereof. The likelihood calculation circuit calculates likelihood of the plural-bit data stores in the memory cells based on the soft-value.

16 Claims, 14 Drawing Sheets

LOWER PAGE READ OPERATION

UPPER PAGE READ OPERATION

NON-VOLATILE SEMICONDUCTOR STORAGE SYSTEM

CROSS REFERENCE TO RELATED APPLICATIONS

This application is based on and claims the benefit of priority from prior Japanese Patent Application No. 2006-184362, filed Jul. 4, 2006, the entire contents of which are incorporated herein by reference.

BACKGROUND OF THE INVENTION

1. Field of the Invention

The present invention relates to a non-volatile semiconductor storage system, and particularly, to a non-volatile semiconductor storage system enabled to store two bit or more data in one memory cell.

2. Description of the Related Art

One of the well-known non-volatile semiconductor storage devices is a NAND cell type flash memory. The NAND cell type flash memory includes a memory cell array including a plurality of NAND cell units. Each NAND cell unit includes a plurality of memory cells connected in series and two selection transistors connected to both ends thereof. The memory cell holds, in an erase state, data "1" having a negative threshold voltage. In a data write operation, a floating gate is injected with electrons to rewrite data "0" having a positive threshold voltage. The NAND cell type flash memory may change the threshold voltage only from a lower value to a higher value in a data write operation, and may change the threshold voltage in the reverse direction (from a higher value to a lower value) only by an erase operation per a block.

For the purpose of increasing the memory capacity, a so-called multi-value NAND cell type flash memory has recently been developed, which stores two bit or more data in one memory cell. By way of example, a four-value NAND cell type EEPROM may store four-value (two-bit) data ("00," "01," "10," and "11") in a memory cell.

An n-value NAND cell type EEPROM includes a plurality of latch circuits per a single bit-line connected to the selected memory cell (see, for example, JP 2004-192789 (paragraphs from 0025 to 0139 and others). Specifically, when n-value data is written or read to or from the selected memory cell, the latch circuits serve to temporarily store the n-value data. For a four-value NAND cell type EEPROM, for example, in a write or a read operation, four-value (two-bit) data is temporarily stored in two latch circuits provided per one bit-line connected to the selected memory cell.

Such a multi-value storage scheme, however, has increased a probability of fail bit occurrence in a memory cell array greatly as the memory cell is miniaturized, thus lowering the yield of non-volatile memory chips. In considering this situation, a memory with an error correction circuit using an error correction code (ECC) in order to guarantee data reliability of a memory cell has been proposed (for example, see JP 2002-251884 (Paragraph 0026-0030 etc.))

However, in an n-value storage flash memory, it is necessary to set up n types of threshold voltage distributions. This causes the distances between the threshold voltage distributions or data margins to be smaller than those in a two-value (binary) storage flash memory. As "n" becomes larger, the data margin becomes smaller (in some cases, some distributions overlap one another, thus making the margin disappear), and it is likely that the probability of write error becomes larger. If the probability of write error becomes higher, conventional ECC circuit cannot deal with this problem.

SUMMARY OF THE INVENTION

A non-volatile semiconductor storage system according to an aspect of the present invention comprises: a memory cell array comprising a plurality of memory cells enabled to store multi-value data, the memory cells being arranged along a plurality of bit-lines and a plurality of word-lines; a bit-line control circuit connected to the bit-lines to control the bit-line; a word-line control circuit controlling applying a plural-bit data read voltage as a word line voltage to the word line, the plural-bit data read voltage being larger than an upper limit of one of plural threshold voltage distributions representing the plural-bit data and smaller than a lower limit of another threshold voltage distribution with higher threshold voltages than the one of the plural threshold voltage distributions, and applying a soft-value read voltage as a word line voltage to the word line, the soft-value read voltage being smaller than an upper limit of each of the plurality of the threshold voltage distributions and larger then a lower limit thereof to generate a plurality of soft-values: and a likelihood calculation circuit calculating a likelihood of plural-bit data stored in the memory cell based on the soft-value generated by setting the word-line voltage at the soft-value read voltage.

DETAILED DESCRIPTION OF THE EMBODIMENTS

With reference to the accompanying drawings, preferred embodiments of the present invention will be described in more detail with respect to an example of a four-value NAND cell type flash memory.

[Basic Principle]

Figure 1:
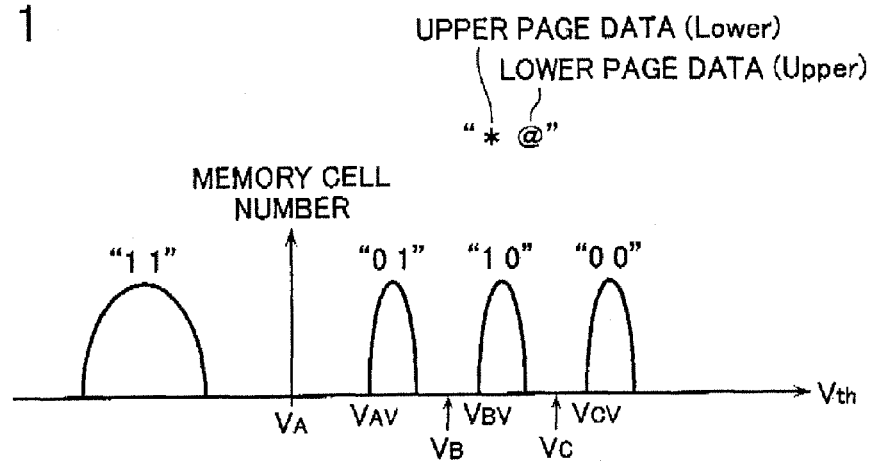
FIG. 1 shows an example of write data in a four-value storage flash memory.

A four-value NAND cell type flash memory is adapted to allow its one memory cell to have a threshold voltage having four types of distributions. FIG. 1 shows two-bit, four-value data (data "11," "10," "01," and "00") stored in a memory cell of the four-value NAND cell type flash memory and a distribution of a threshold voltages (Vth) of a memory cell. Note that in FIG. 1, VA, VB, and VC are voltages applied to selected word-lines when reading four sets of data, and VAv, VBv, and VCv indicate verify voltages.

A memory cell after a block erasure is indicated as data "11." The memory cell has a negative threshold voltage Vth. Memory cells containing data "01," "10," and "00" in a write state have a positive threshold voltage Vth. The data "01" in a write state has the lowest threshold voltage. The data "00" has the highest threshold voltage. The data "10" has a threshold voltage between the voltages of data "01" and data "00."

The two-bit data in one memory cell includes lower page data and upper page data. The lower and upper page data are written to the memory cell by different write operations, specifically, by two write operations. In an expression of data "*@", "*" indicates the upper page data, and "@" indicates the lower page data.

The lower page data write operation is first described with reference to FIG. 2. It is assumed that all memory cells are in an erase state, i.e., they have data "11." Referring to FIG. 2, when the lower page data is written, the threshold voltage Vth of the memory cell is divided into two distributions depending on the lower page data ("1" or "0"). When, specifically, the lower page data is "1," the tunnel oxide layer of the memory cell is not applied with a high electric field, thus suppressing increase of the threshold voltage Vth of the memory cell. The memory cell thus maintains the erase state data (data "11").

When the lower page data is "0," the tunnel oxide layer of the memory cell is applied with a high electric field to inject electrons to the floating gate electrode. The threshold voltage Vth of the memory cell is thus increased by a predetermined amount. Specifically, the verify potential VBv' is set, and the write operation is repeated until the threshold voltage equals the verify potential VBv' or more. The memory cell thus changes to the write state (data "10"). Note that the data "10" has a wider threshold voltage distribution than that of the data "11" because the write operation affects the adjacent cells.

The upper page data write operation is now described with reference to FIG. 3. The upper page data is written according to write data (upper page data) input from outside the chip and lower page data already written to the memory cell.

Figure 3:
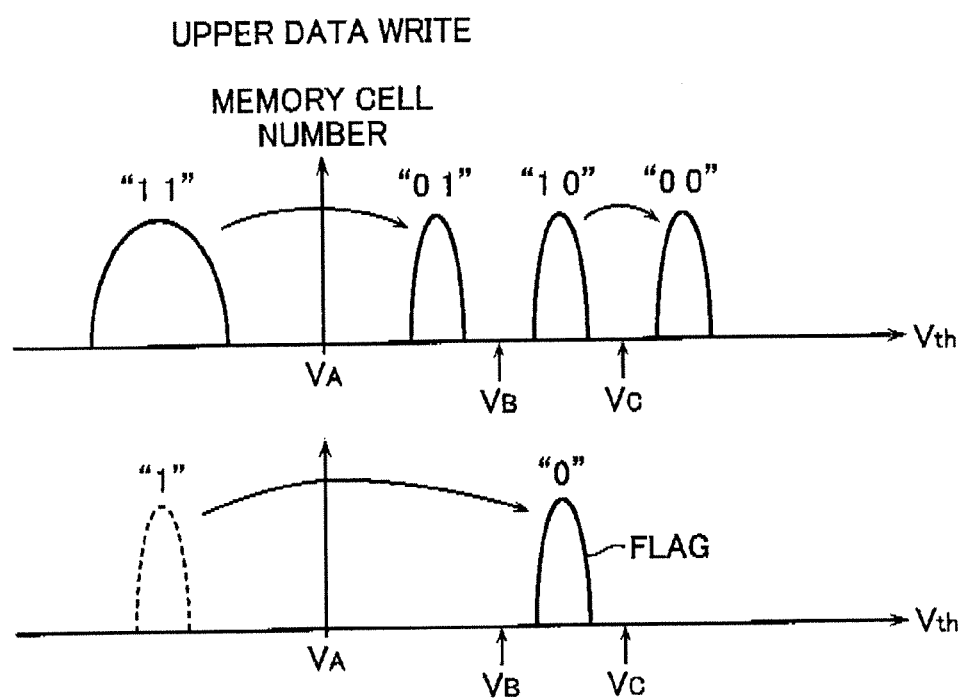
FIG. 3 is another schematic diagram of a data write process in a four-value storage flash memory.

Referring to FIG. 3, specifically, when the upper page data is "1," the tunnel oxide layer of the memory cell is not applied with a high electric field, thus suppressing increase of the threshold voltage Vth of the memory cell. The memory cell of data "11" (erase state) thus maintains the data "11," and the memory cell of data "01" maintains the data "01."

When the upper page data is "0", the tunnel oxide layer of the memory cell is applied with a high electric field to inject electrons to the floating gate electrode. The threshold voltage Vth of the memory cell is thus increased by a predetermined amount. The memory cell of data "11" (erase state) thus changes to data "01," and the memory cell of data "10" changes to data "00."

The above operations may be summarized as follows, (1) When the lower page data is "1" and the upper page data is "1," the erase state cell maintains the data "11."

(2) When the lower page data is "0" and the upper page data is "1," the data "10" is written to the memory cell.

(3) When the lower page data is "1" and the upper page data is "0," the data "01" is written to the memory cell.

(4) When the lower page data is "0" and the upper page data is "0," the data "00" is written to the memory cell.

(5) The write operations of (1) to (4) each include two write operations: the first lower page data write operation and the subsequent higher page data write operation.

It is necessary to store, in any storage means, data indicating whether the memory cell MC is at the stage where the lower page data write operation has been ended and the upper page data write operation has not been ended yet, or at the stage where the lower page data write operation has been ended and the upper page data write operation also has been ended. This is indicated by flag data FLAG stored in a memory cell (flag cell) similar to a memory cell that stores data. Referring to FIGS. 2 and 3, when the memory cell is at the former stage, the flag data FLAG is "1" (a negative threshold voltage), and when the memory cell is at the latter stage, the flag data FLAG is "0" (a threshold voltage of VB or more).

[Memory Configuration]

Figure 4:
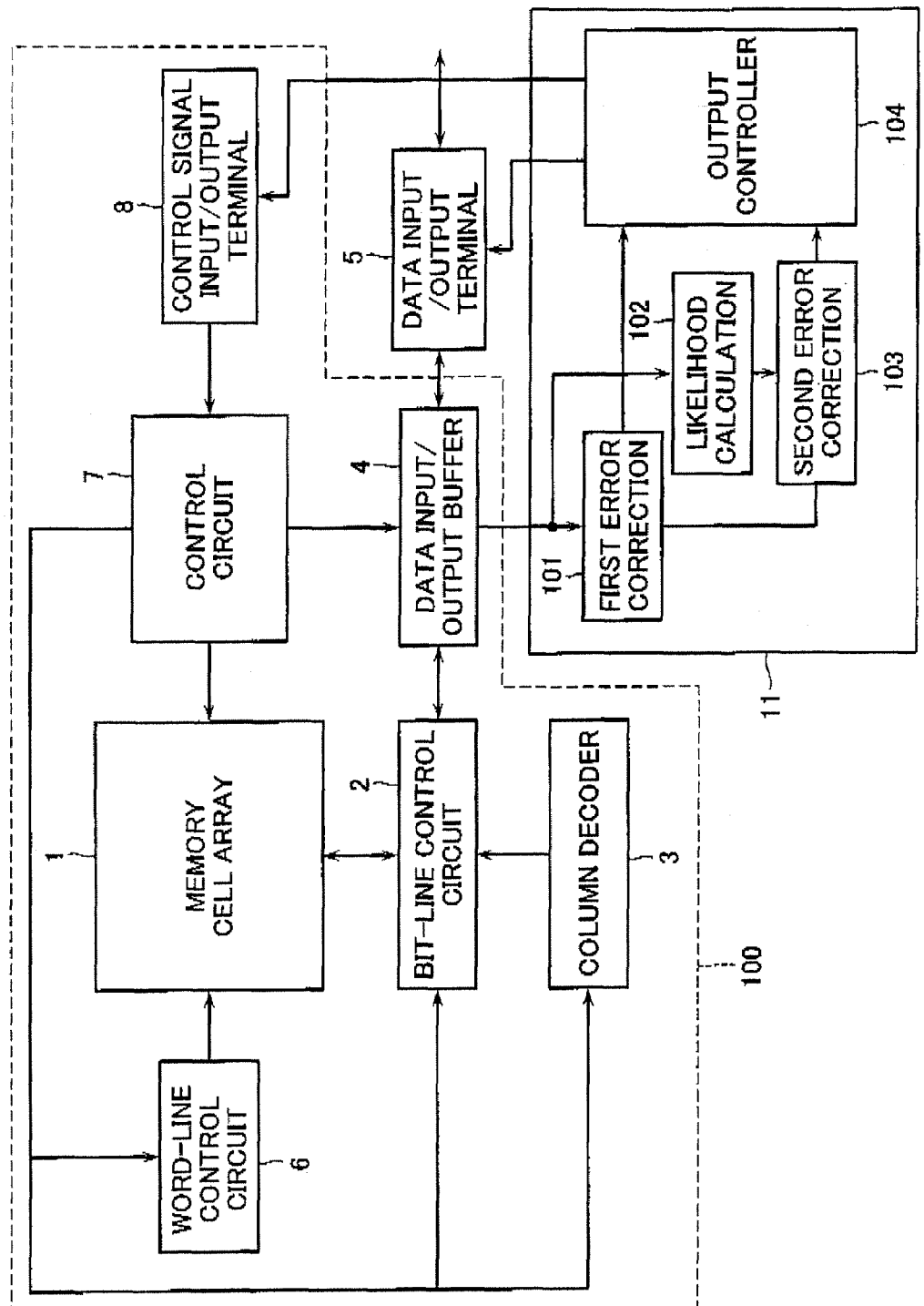
FIG. 4 is a schematic diagram of a configuration of a NAND cell type flash memory according to a first embodiment of the present invention.

FIG. 4 shows, as an example of a non-volatile semiconductor storage device, a configuration of a NAND cell type flash memory that stores four-value (two-bit) data. The flash memory includes a memory cell array 1. The array 1 includes memory cells that store data. The memory cells are arranged in a matrix. The memory cell array 1 includes a plurality of bit-lines, a plurality of word-lines, and a common source line. The array 1 includes memory cells that may electrically rewrite data. The memory cells are arranged in a matrix at the intersection points of the bit-lines and the word-lines. The memory cells may store multi-value data as information bit. In addition, it may store a redundant data attached to the information bit for error correction, and flag data FLAG.

Connected to the memory cell array 1 are a bit-line control circuit 2 to control the bit-line and a word-line control circuit 6 to control the word-line voltage. The bit-line control circuit 2 is a sense amplifier/latch circuit that reads via the bit-line data of the memory cell in the memory cell array 1. In addition, it serves to hold read data or written data. The control circuit 2 also writes data, via the bit-line, in the memory cell in the memory cell array 1 by applying a write control voltage to the memory cell.

Connected to the bit-line control circuit 2 are a column decoder 3, a data input-output buffer 4, a data input-output terminal 5, and a controller 11.

After being read from the memory cell array 1, the data of the memory cell is output outside, via the bit-line control circuit 2, the data input-output buffer 4 and the controller 11, from the data input-output terminal 5. The memory cell array 1, the bit-line control circuit 2, the column decoder 3, the data input-output buffer 4, the word-line control circuit 6 and the control signal input terminal 8 make up a non-volatile semiconductor storage device 100. These components, the controller 11 and the data input-output terminal 5 make up a non-volatile semiconductor storage system. After being input to the data input-output terminal 5 from the outside, the write data is input, via the data input-output buffer 4, to the bit-line control circuit 2 by the column decoder 3. A specified memory cell is thus written.

The memory cell array 1, the bit-line control circuit 2, the column decoder 3, the data input-output buffer 4, the word-line control circuit 6 and the controller 11 are connected to a control circuit 7. The control circuit 7 generates, according to a control signal input to a control signal input terminal 8, a control signal and a control voltage to control the memory cell array 1, the bit-line control circuit 2, the column decoder 3, the data input-output buffer 4, the word-line control circuit 6 and the controller 11.

The word line control circuit 6 applies, on read operation, plural-bit-data read voltages (in FIG. 1, VA, VB, VC) and verify voltages to the word-lines WL as word-line voltages. The plural-bit-data read voltages are between the upper limit in one of the four threshold voltage distributions (FIG. 1) representing the four data and the lower limit of another threshold voltage distribution with a larger value.

In addition, the word line control circuit 6 performs control of applying plural kinds of voltages (soft-value read voltage) to the word lines WL as word-line voltages. The soft-value read voltage is between the upper limit and the lower limit in one of the four threshold value distributions, for generating soft-values as described later in detail.

Moreover, the controller 11 comprises a first error correction circuit 101, a likelihood calculation circuit 102, a second error correction circuit 103, and an output control circuit 104.

The first error correction circuit 101 conducts error correction of plural-bit data (upper page data, lower page data) read by applying the plural-bit data read voltages VA, VB and VC to the word-lines WL, based on the redundant data for the error correction attached to the plural-bit data.

Although redundant data may be stored in the memory cells in the same sector where the plural-bit data is stored, and may be read simultaneously, the present invention is not limited to this.

When the redundant data m is attached to the information bit of k bits, the number of correctable correction bits is limited. If the number of data error exceeds the number of correctable correction bits, the correction by the first error correction circuit 101 becomes impossible.

It is also possible to deal with the problem by increasing the redundant data m. However, it will be an obstacle to improvement in integration of a memory device, thus diluting the meaning of plural bit storage. Therefore, in this embodiment, the likelihood calculation circuit 102 and the second error correction circuit 103 conduct error correction of data that has not been corrected (i.e. error correction is unsuccessful) by the first error correction circuit 101.

The likelihood calculation circuit 102 calculates "certainty" (likelihood) of the plural-bit data read, based on the soft-value data generated in the bit-line control circuit 2. The soft-value data is generated in the bit line control circuit 2 based on the data read when above-mentioned soft-value read voltages are applied to the word lines WL. The example of this soft-value data is mentioned later. For example, the likelihood calculation circuit 102 has a likelihood table (not shown) storing soft-value data and likelihood associated to each other, and can judge and output likelihood by referring to this likelihood table.

The second error correction circuit 103 serves to correct data judged as low in degree of "certainty" (likelihood), so that it complements the first error correction circuit 101.

The output control circuit 104 performs control of outputting data after error correction by the first error correction circuit 101 or the second error correction circuit 103 to the data input-output terminal 5. Specifically, when the data error correction by the first error correction circuit 101 has been completed, it outputs plural-bit data after error correction by the first error correction circuit 101 to the data input-output terminal 5, without experiencing correction by the second error correction circuit 103. On the other hand, when the data error correction is not completed by the first error correction circuit 101 only, it outputs data from the second error correction circuit 103.

Figure 5:
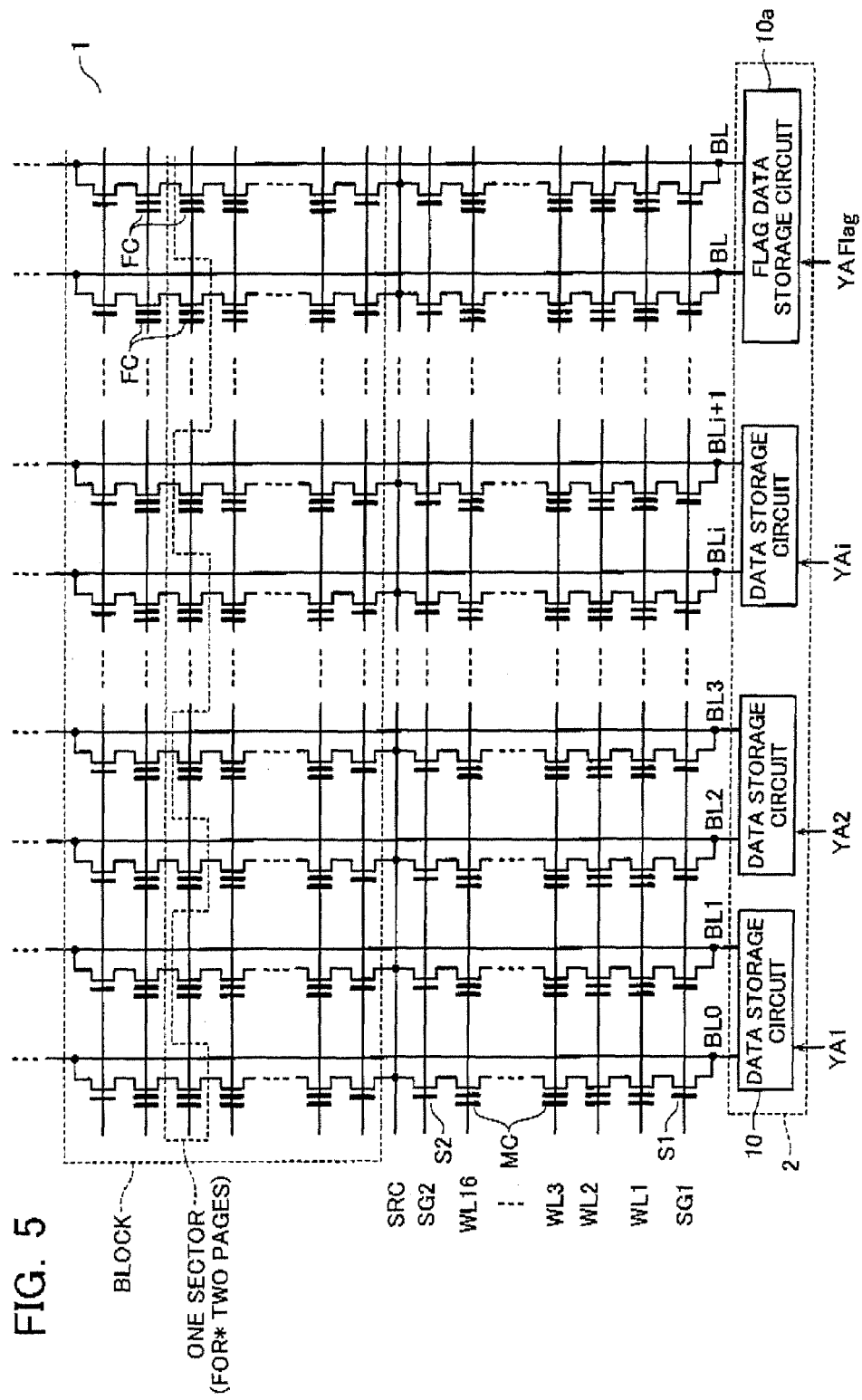
FIG. 5 is a circuit diagram of a configuration of the memory cell array 1 and the bit-line control circuit 2 in FIG. 4.

FIG. 5 shows configurations of the memory cell array 1 and the bit-line control circuit 2 in FIG. 4. The memory cell array 1 is a NAND cell type memory cell array. The array 1 includes a plurality of NAND cells. One NAND cell includes memory cells MC comprising, for example, 16 EEPROMs connected in series and selection gates S1 and S2 connected to both ends thereof. The selection gate S1 is connected to a bit-line BL0. The selection gate S2 is connected to a source line SRC.

The memory cell MCs arranged on the same row have control gates that is commonly connected to word-lines WL1, WL2, and WL3 to WL16. The first selection gates S1 is commonly connected to a select line SG1. The second selection gates S2 is commonly connected to a select line SG2.

The memory cell array 1 includes, as shown by a broken line, a plurality of blocks. Each block includes a plurality of NAND cells. Data is erased per a block. The erase operation is performed at the same time on two bit-lines connected to a data storage circuit 10 or a flag data storage circuit 10a.

The bit-line control circuit 2 includes a plurality of the data storage circuits 10 and the flag data storage circuit 10a. Connected to the data storage circuits 10 and the flag data storage circuit 10a are respective pairs of bit-lines (BL0 and BL1), (BL2 and BL3) ... (BLi and BLi+1), and (BL and BL). Each data storage circuit 10 has a function of holding data read from the memory cell MC. The storage circuit 10 also has a function of holding data to be written to the memory cell MC. The storage circuit 10 also serves to operate internal data in multi-value data storage, as described below.

A plurality of memory cells (enclosed by a broken line) form one sector. The memory cells in one sector are arranged on every other bit-line and are connected to one word-line. Data is written to and read from each sector. One sector stores, for example, two-page data. Connected to each word-line is a flag cell FC to store the flag data FLAG. The flag cell FC stores the flag data FLAG. The flag data FLAG is "1" when the lower page data write operation has been ended in the memory cell MC. The flag data FLAG is "0" when the upper page data write operation has been ended.

In a read operation, a program verify operation, and a program operation, one bit-line is selected from the two bit-lines (BLi and BLi+1) connected to the data storage circuit 10 according to the address signal (YA1, YA2, ... , YAi, and YAflag) specified from the outside. Also, according to the external address, one word-line is selected and one sector (for two pages) is selected. Switching between the two pages is performed according to the address.

Figure 6:
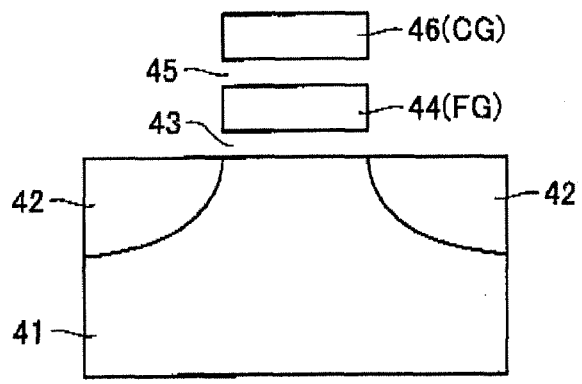
FIG. 6 is a cross sectional view of the memory cell MC in FIG. 5.
Figure 7:
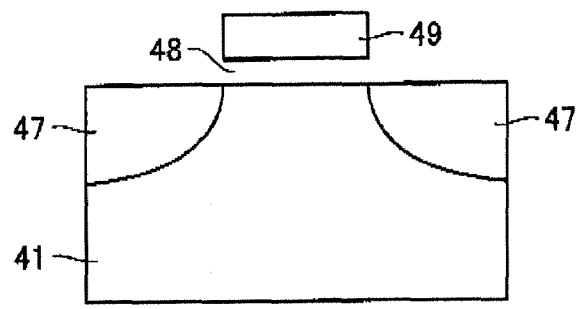
FIG. 7 is a cross sectional view of the selection gates S1 and S2 in FIG. 5.

FIGS. 6 and 7 show cross-section structures of the memory cell MC and the selection gates S1 and S2. FIG. 6 shows a cross-section structure of the memory cell MC. The substrate 41 has n-type diffusion layers 42 formed therein. The diffusion layers 42 function as a source and a drain of MOSFET included in the memory cell MC, respectively. The substrate 41 also has a floating gate (FG) 44 formed thereon via a gate-insulating layer 43. The floating gate 44 has a control gate (CG) 46 formed thereon via the insulating layer 45.

The selection gates S1 and S2 each include a substrate 41 and n-type diffusion layers 47 formed in the substrate 41. The diffusion layers 47 serve as a source and a drain, respectively. The substrate 41 has a control gate 49 formed thereon via a gate-insulating layer 48.

Figure 8:
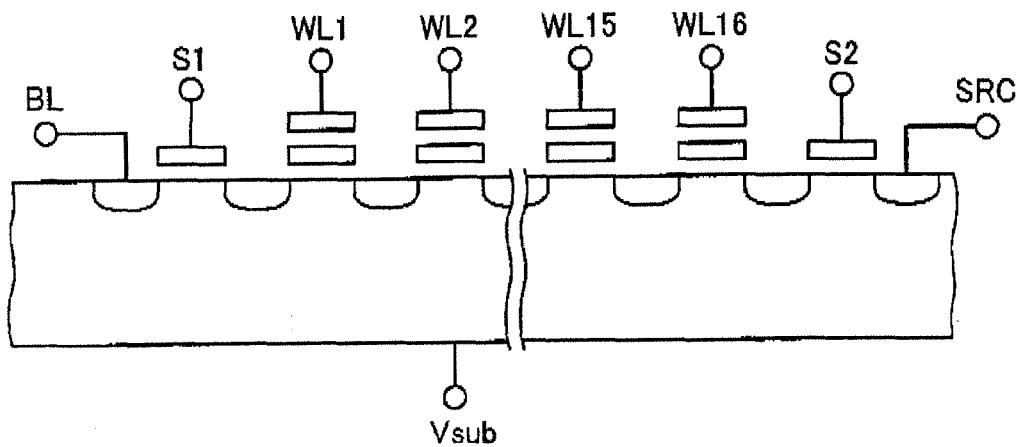
FIG. 8 is a cross sectional view of one NAND cell in a memory cell array.

FIG. 8 shows a cross section of one NAND cell in the memory cell array. In this example, the one NAND cell includes 16 memory cells MC connected in series, each having a configuration in FIG. 6. The NAND cell includes, on its drain side and source side, the first selection gates S1 and S2 each having a configuration in FIG. 7.

Figure 9:
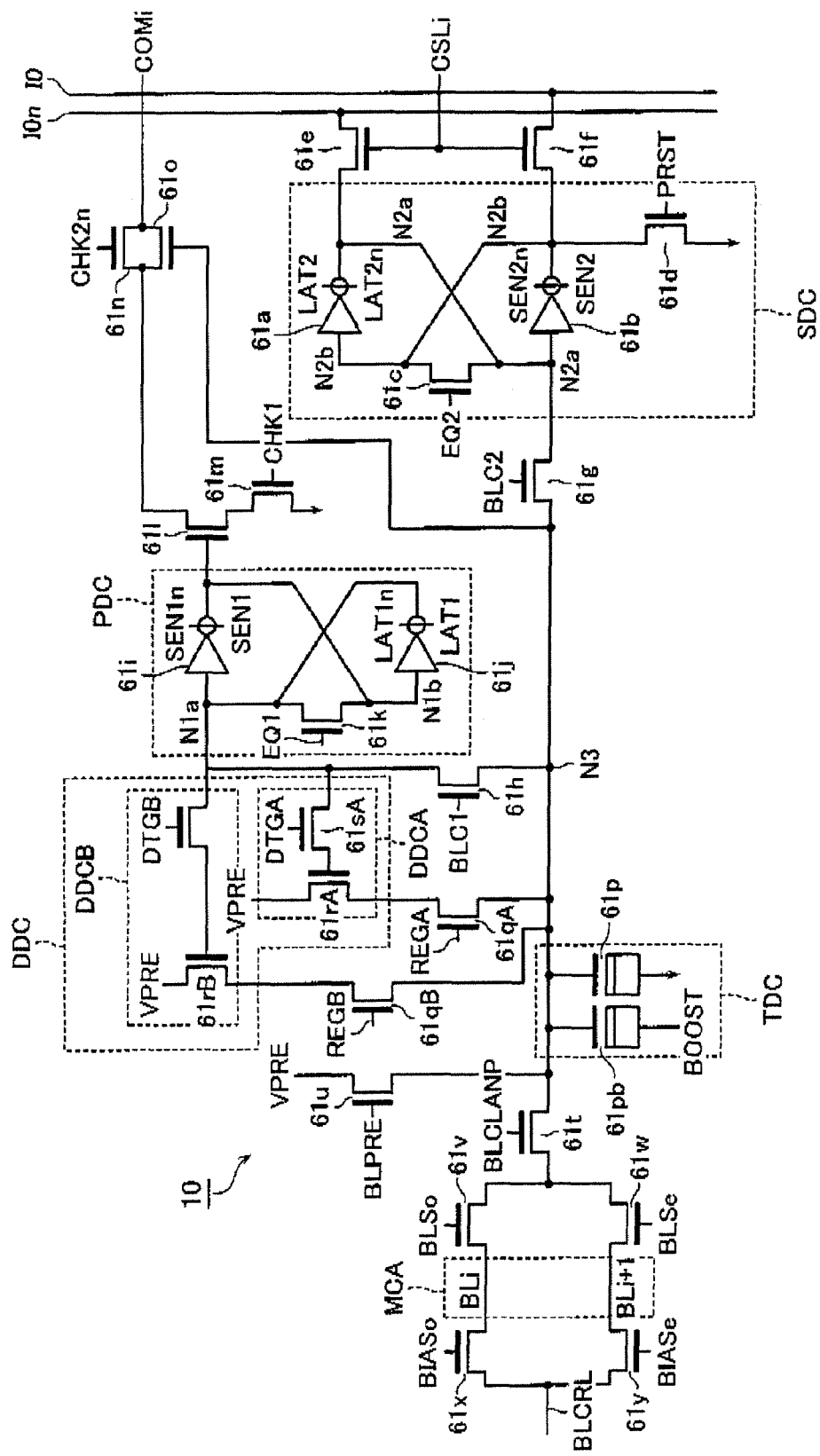
FIG. 9 is a circuit diagram of an example configuration of the data storage circuit 10 in FIG. 5.

An example configuration of the data storage circuit 10 is described below with reference to FIG. 9. Note that the data storage circuit 10a has a similar configuration to the circuit 10, so its description is omitted here. The data storage circuit 10 includes a primary data cache (PDC), a secondary data cache (SDC), a dynamic data cache (DDC), and a temporary data cache (TDC).

The SDC, PDC, and DDC hold input data in a write operation, hold read data in a read operation, temporarily hold data in a verify operation, and are responsible for data storage to operate internal data in multi-value data storage. The TDC amplifies bit-line data and temporarily holds the data in a data read operation. The TDC is also used to operate internal data in multi-value data storage.

The SDC includes clocked inverter circuits 61a and 61b and transistors 61c and 61d. The inverter circuits 61a and 61b make up a latch circuit. The transistor 61c is connected between the input terminals of the clocked inverter circuits 61a and 61b. The transistor 61c receives at its gate a signal EQ2.

The transistor 61d is connected between the output terminal of the clocked inverter circuit 61b and the ground. The transistor 61d receives at its gate a signal PRST.

The SDC has a node N2a (the output terminal of the clocked inverter circuit 61a). The node N2a is connected, via a column selection transistor 61e, to an input-output data line IOn. The SDC also has a node N2b (the output terminal of the clocked inverter circuit 61b). The node N2b is connected, via a column selection transistor 61f, to an input-output data line IO. The column selection transistors 61e and 61f receive at their gates a column selection signal CSLi.

The PDC includes clocked inverter circuits 61i and 61j and a transistor 61k. The inverter circuits 61i and 61j make up a latch circuit. The transistor 61k is connected between the input terminals of the clocked inverter circuits 61i and 61j. The transistor 61k receives at its gate a signal EQ1. A node N1a of the PDC and the node N2a of the SDC are connected via transistors 61g and 61h. The transistor 61g receives at its gate a signal BLC2. The transistor 61h receives at its gate a signal BLC1.

The PDC also has a node N1b (the input terminal of the clocked inverter circuit 61j). The node N1b is connected to the gate of a transistor 61l. The current path of the transistor 61l has one end grounded via a transistor 61m. The transistor 61m receives at its gate a signal CHK1. The current path of the transistor 61l has the other end connected to one ends of the current paths of transistors 61n and 61o both making up a transfer gate. The transistor 61n receives at its gate a signal CHK2n. The gate of the transistor 61o is connected to a connection node between the transistors 61g and 61h.

The current paths of the transistors 61n and 61o have the other ends supplied with a signal COMi. The signal COMi is a signal common to all data storage circuits 10. The signal COMi indicates whether verification of all data storage circuits 10 is complete. After the verification is complete, the node N1b of the PDC changes to "L," as described below. In this condition, changing the signals CHK1 and CHK2n to "H." causes the signal COMi to become "H", if the verification is complete.

The TDC includes, for example, a MOS capacitor 61p. The MOS capacitor 61p is connected between the ground and a connection node N3 between the transistors 61g and 61h. Connected to the connection node N3 via a transistor 61q, is the DDC. The transistor 61q receives at its gate a signal REG.

The DDC includes transistors 61r and 61s. The current path of the transistor 61r has one end supplied with a signal VREG. The current path has the other end connected to the current path of the transistor 61q. The gate of the transistor 61r is connected via the transistor 61s to the node N1a of PDC. The transistor 61s receives at its gate a signal DTG.

Also connected to the connection node N3 are one ends of the current paths of transistors 61t and 61u. The current path of the transistor 61u has the other end supplied with a signal VPRE. The transistor 61u receives at its gate a signal BLPRE.

The transistor 61t receives at its gate a signal BLCLAMP. The current path of the transistor 61t has the other end connected via a transistor 61v to a bit-line BLi. The other end is also connected via a transistor 61w to a bit-line BLi+1.

The bit-line BLi has the other end connected to one end of the current path of a transistor 61x. The transistor 61x receives at its gate a signal BlASo. The bit-line BLi+1 has the other end connected to one end of the current path of a transistor 61y. The transistor 61y receives at its gate a signal BlASe. The current paths of the transistors 61x and 61y have the other ends supplied with a signal BLCRL. The transistor 61x and 61y turn on, according to the signals BlASo and BlASe, in a complementary manner with the transistors 61v and 61w. The transistor 61x and 61y supply the unselected bit-line with the potential of the signal BLCRL.

[Write Operation and Verify Operation]

Figure 10:
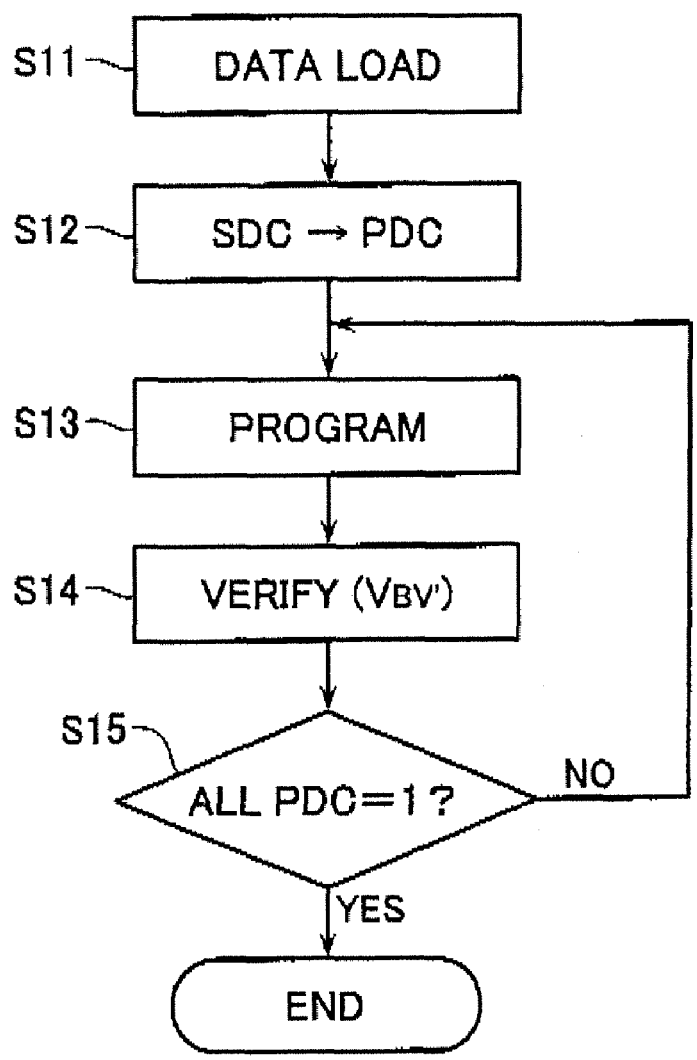
FIG. 10 is a flowchart of a write process of lower page data included in four-value data.
Figure 11:
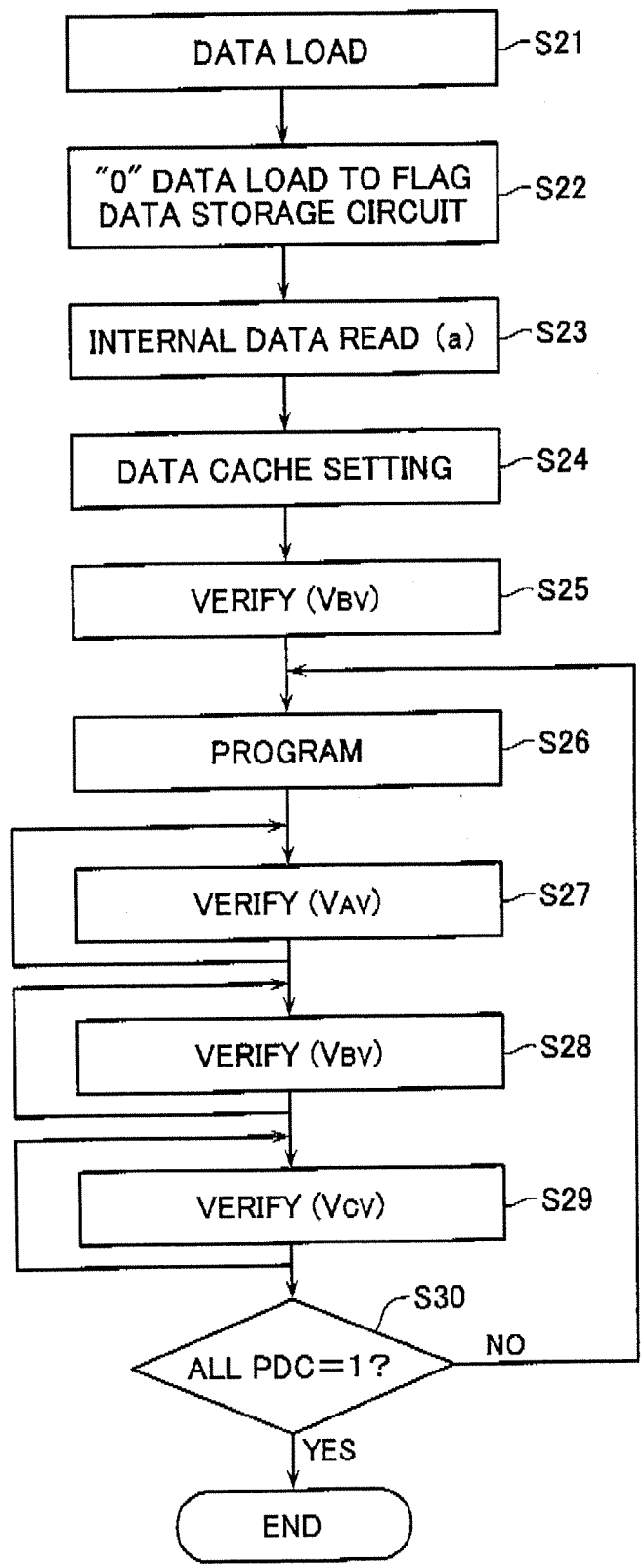
FIG. 11 is a flowchart of a write process of upper page data included in four-value data.

The multi-value write operation and the write verify operation in the NAND cell type flash memory is described with reference to FIGS. 10 and 11. The write operation is performed in two stages: the lower page data write operation and the upper page data write operation, Referring to FIG. 10, first, to select a lower page of one sector in FIG. 5, an address is assigned, and write data is input from the outside and stored in the SDC in all data storage circuits 10 (S11).

A write command input may turn on the transistors 61h and 61g, thus transferring data of the SDC to the PDC in all data storage circuits 10 (S12). When data "1" is input from the outside as the lower page data, the node N1a of the PDC changes to "H." When data "0" is input, the node N1a of the PDC changes to "L." Note that in the lower page data write operation, no data is written to the flag cell FC. The PDC in the flag data storage circuit 10a thus has data "1."

The operation then shifts to a memory cell MC write (program) operation (S13). Specifically, the transistors 61h, 61t bit, and 61v or 61w turn on, thus supplying data held in the PDC to the bit-line BLi or BLi+1. When the PDC holds data "1", the bit-line changes to Vdd. When the PDC holds data "0," the bit-line changes to Vss (ground potential). To avoid the unselected page cells from being written, the unselected page bit-lines are also supplied with Vdd.

The select line SG1 of the selected block is applied with Vdd. The word-line of the selected cell is applied with a potential VPGM (20V). The word-line of the unselected cell is applied with a potential VPASS (10V). This allows the write operation to the selected cells and avoids the write operation to the unselected cells.

The operation then shifts to a write verify operation (S14). First, the unselected word-line and the select line SG1 are provided with a potential Vread for a read operation, and the bit-line is precharged to 1V. The selected word-line is provided with the verify potential VBv'. The select line SG2 on the source side of the memory cell is changed to "H." When the selected memory cell MC has a threshold voltage higher than the verify potential VBv', the memory cell MC maintains the off state, thus leaving the bit-line "H." When the selected memory cell MC has a threshold voltage lower than the verify potential VBv', the memory cell MC turns on, thus changing the bit-line to "L." The node N3 of the TDC changes to "L" when the bit-line is "L." The node N3 changes to "H" when the bit-line is "H."

When the DDC is written with "0" on it stores "L." When the DDC is not written with "0", it stores "H." When the signal VREG is set to Vdd and the signal REG is set to "H," the node N3 of the TDC is forced to be "H" only when the DDC is not written with "0." Then the PDC's data is transferred to the DDC, and the TDC's potential is transferred to the PDC.

Under the above operations, when the PDC is "L," the write operation is performed again, and the program operation and the verify operation are repeated until all data storage circuits 10 have data "H" (S15-S13). When thereafter the adjacent memory cells are written sequentially, the threshold voltage of the memory cell rises depending on the write data due to the FG to FG capacitance, thus spreading the threshold voltage distribution of the data "10" toward the higher direction.

The upper page data write (program) operation is now described with reference to FIG. 11. Also in the upper page data write operation, an address is first assigned, and then write data is input from the outside and stored in the SDC in all data storage circuits 10 (S21).

When, thereafter, the write command is input, the data "0" is written to the flag cell FC as the flag data FLAG, and the data "0" is input to the SDC in the flag cell data storage circuit 10a (S22).

The internal data is then read to determine whether data after the upper page is written is "11" (the lower page data is "1") or "10" on (the lower page data is "0") (S23). The selected word-line is supplied with the potential VA (FIG. 1). The unselected word-line and the select line SG1 are supplied with the potential Vread.

When the memory cell has data of "10," the PDC latches "H." When the memory cell has data of "11," the PDC latches "L."

Thereafter, depending on whether data to be written is "11," "01," "10," or "00," data to be stored in each data cache SDC, PDC, TDC, or DDC is set (S24).

Then, before the write operation, the data "10" is verified (S25). Subsequently, similar to the lower page data write operation, the write operation is performed (S26).

Further, for the data "01," "10," and "00," the potential is set to VAv, VBv, and VCv, and the data is verified (S27 to S29). Until the PDC in all data storage circuits 10 has data of "H." the write and verify operations are repeated (S30).

[Read Operation]

The read operation is now described with respect to the lower page data read and the upper page data read.

Figure 12:
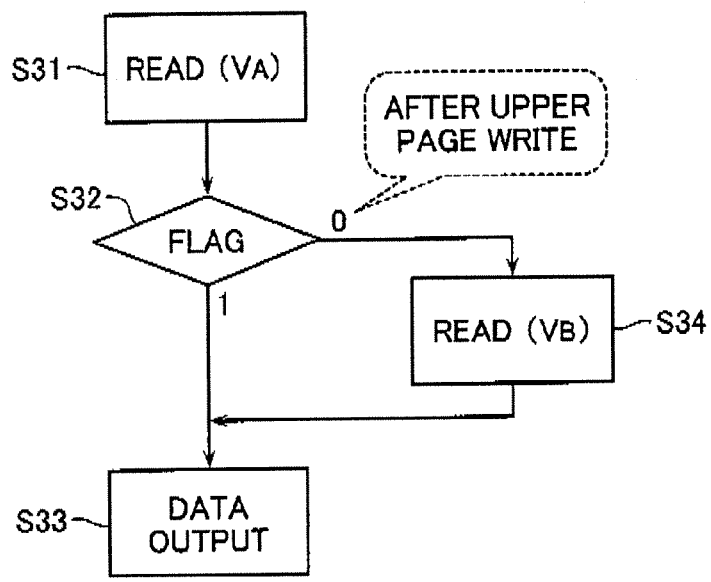
FIG. 12 is a flowchart of a read process of lower page data in four-value data.

FIG. 12 shows a flowchart of the process of the lower page data read. First, an address is assigned to select one sector in FIG. 5. Then, the potential of the selected word-line is set to VA and the read operation is performed (S31), thus determining whether the flag cell FC has flag data FLAG of "0" or "1" (S32).

Figure 2:
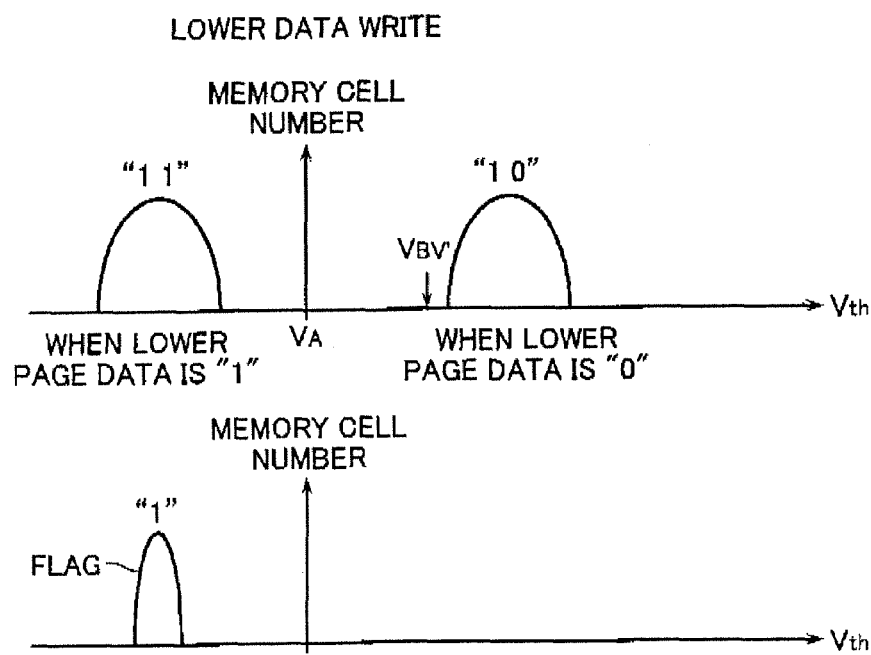
FIG. 2 is a schematic diagram of a data write process in a four-value storage flash memory.

When the flag data FLAG read from the flag cell FC is "1," the upper page data write operation is not complete, and the memory cell MC has a threshold voltage distribution as shown in FIG. 2. The data may be read with the word-line potential being set to VA. The data is thus already read to the data storage circuit 10. Therefore, the data stored in the data storage circuit 10 is output outside for reading (S33).

When the flag data FLAG read from the flag cell FC is "0" (the memory cell has data of "1"), the upper page data write operation is complete, so the memory cell MC has a threshold voltage distribution as shown in FIG. 3. Therefore, the word-line potential is set to VB and the read operation is performed (S34), and the data read to the data storage circuit 10 is output outside (S33). Each data cache in the data storage circuit 10 then has an operation similar to those in the write and verify operations.

Figure 13:
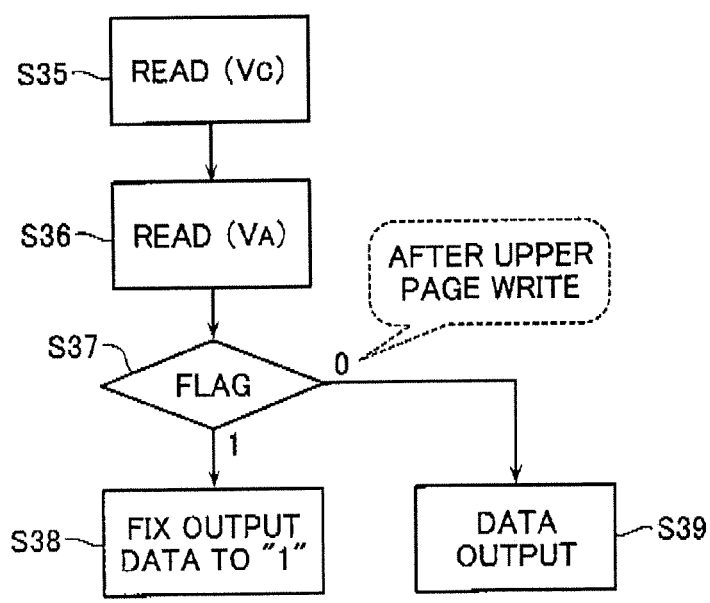
FIG. 13 is a flowchart of a read process of upper page data in four-value data.

The process of the upper page data read operation is described with respect to the flowchart in FIG. 13. In the upper page data read operation, an address is first assigned to select one sector in FIG. 5. Then the word-line potential is set to VC and the read operation is performed (S35). Then the word-line potential is set to VA and the read operation is performed (S36). Then it is determined whether the flag cell FC has flag data FLAG of "0" or "1" (S37).

As a result of this, when the flag data FLAG of the flag cell FC is "1", and the upper page write has not been performed yet, the output data is fixed to "1" (S38). In order to set an output to "1", the signal PRST of the data storage circuit 10 is set at "H," and SDC is set at "1." Alternatively, the data input-and-output buffer 4 is forced to output data "1" only.

Moreover, when the flag data FLAG of the flag cell FC is "0", the upper page data Upper is read based on the data Upper (pre1) held at DDCA, and the data Upper (pre2) newly read (S39). The detailed operation of the data storage circuit 10 in this read operation is explained below.

The newly read data Upper (pre2) is held at TDC. At the same time the signal REGA of the gate of the transistor $61qA$ is set at "H" when VPRE is set at a ground potential. In this case, when the data Upper (pre1) held at DDCA is "0", i.e., the potential of the transistor $61rA$'s gate is "H", the voltage of the node N3 is discharged. On the other hand, when the data Upper (pre1) held at DDCA is "1", i.e., the potential of the transistor $61rA$'s gate is "L", the voltage of the node N3 does not change. That is, when the data Upper (pre1) held at DDCA is "0", the new data Upper (pre2) is compulsorily reversed to "1."

Figure 14:
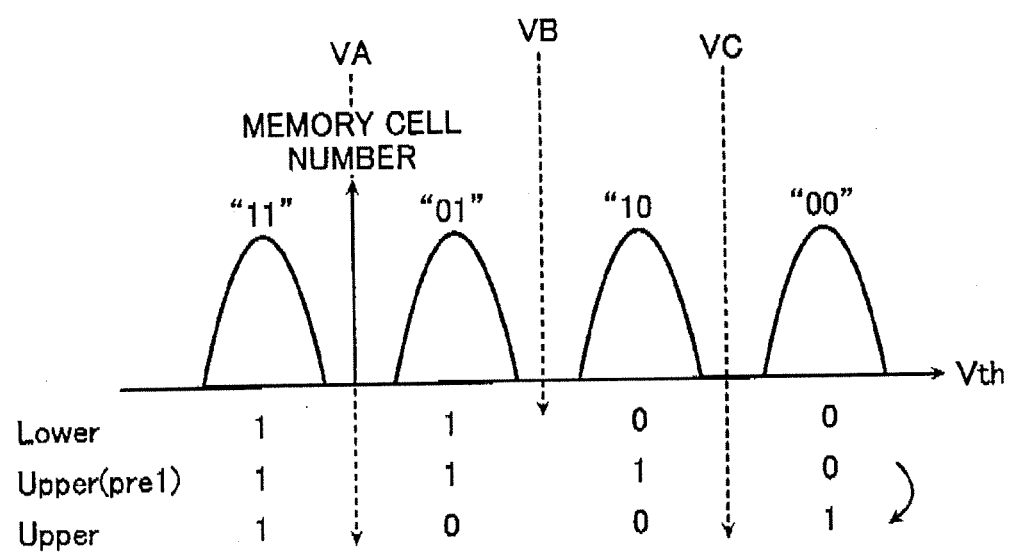
FIG. 14 is a schematic diagram showing a relationship between lower page data Lower and upper page data Upper.

The data held at TDC after the above-described operation has been performed is output outside as upper page data Upper, after it is transferred to SDC. The relation between Data Upper (pre1) and the upper page data Upper is shown in FIG. 14. The lower page data Lower and the upper page data Upper are read in the above process, thereby readout of 4-value data being completed.

When a data error occurred in the 4-value data read in the above-described process, the error detection and the error correction based on redundant data are performed using the first error correction circuit 101 (for example, when data "00" is accidentally read as data "10" (threshold value distributions thereof are close to each other)).

However, reading simply 4-value data only as bit data makes the judgment limited to whether the certainty concerning the threshold value distributions is inflexibly judged as "0" or "1". Specifically, correction capability will be inflexibly determined only by quantity of the redundant data attached to the information bit. When "n" of n-value data stored in one memory cell further becomes large due to the development in miniaturization of memory cells, a write-error occurrence rate becomes higher, and it becomes more difficult to deal with the error only by the first error correction circuit 101 using redundant data.

Accordingly, in the present embodiment, when an error is not corrected by the first error correction circuit 101 and an error correction ended up in failure, the likelihood calculation circuit 102 generates the likelihood indicating the "certainty" of the plural-bit data. Error correction is performed by the second error correction circuit 103 using this likelihood. Thereby, this makes it possible to perform error correction, without increasing the bit number of redundant data. Soft-value data is generated by generating plural soft-value read voltages (4)-(15) by the word-line control circuit 6 as word-line voltages and conducting reading, as shown for example in FIG. 15. The plural soft-value read voltages (4)-(15) are between an upper limit and a lower limit of each of the threshold value distributions of data "11", "01", "10", "00". With such soft-value data, it is possible to judge whether the memory cell to be read is any one of the four data ("11", "01", "10", or "00"). In addition, it is possible to Judge whether the threshold voltage of the memory cell to be read is near the center (the peak) of one of the threshold value distributions, or near the upper limit or the lower limit of one of the threshold value distributions.

When the threshold voltage is close to the upper limit or the lower limit of the threshold value distribution, it is more likely that data error occurs, compared to the case it is close to the center of the threshold value distribution. In other words, the former has a lower "certainty" of the plural-bit data (likelihood) compared to the latter. The second error correction circuit 103 repeats correction of 4-value data in memory cells where soft-value data judged as having a low "certainty" (likelihood) has been obtained, and syndrome calculation after this correction, until all syndromes becomes "0."

Figure 15:
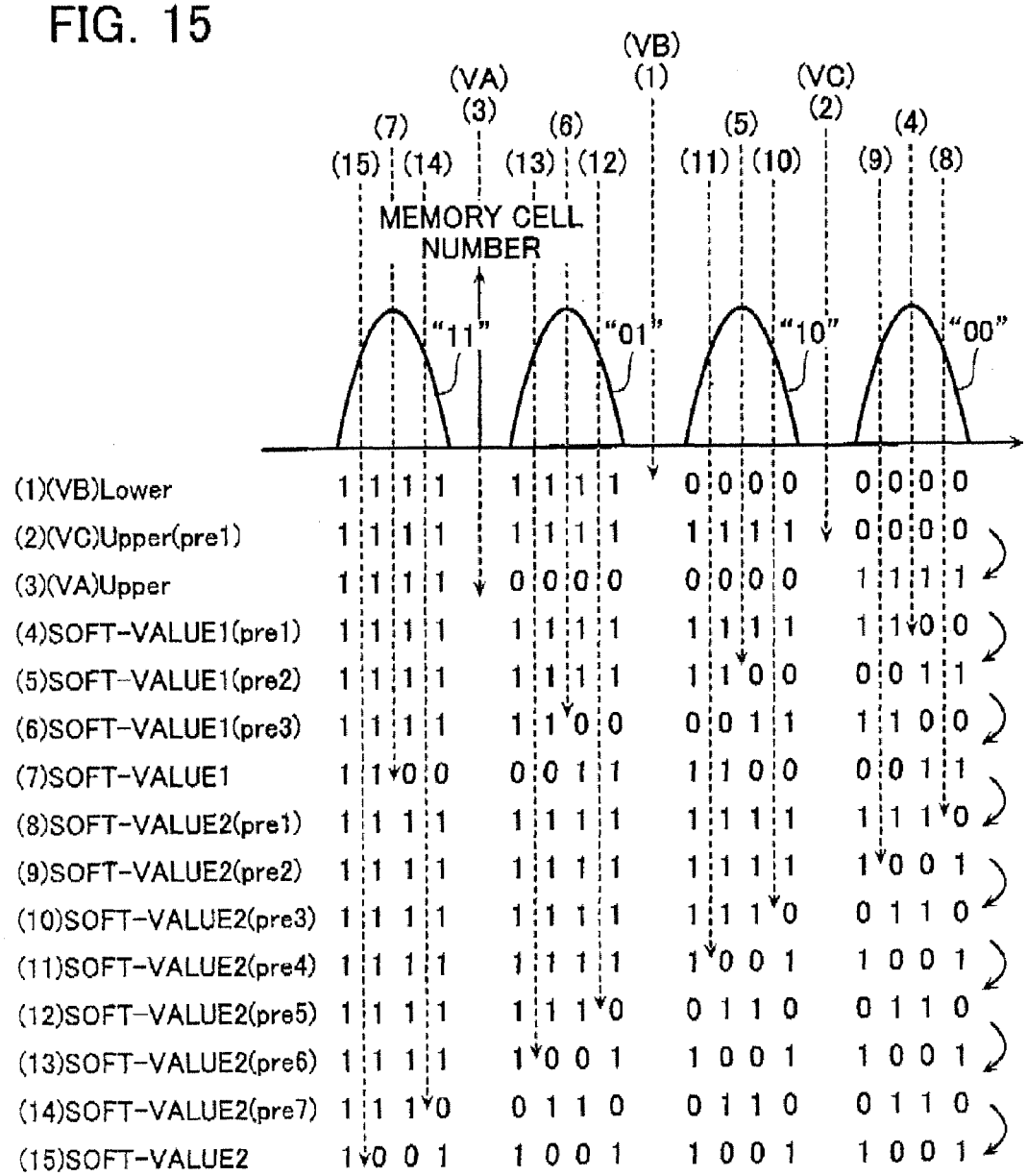
FIG. 15 illustrates a process of generating a soft-value data.

In this FIG. 15, the soft-value read voltages (4)-(7) are near the midpoint of each of the threshold value distributions of data "11", "01", "10", and "00" (approximately middle of an upper limit and a lower limit). Moreover, the other soft-value read voltages (8)-(15) are set so that they divide each of the threshold value distributions at approximately regular intervals with the soft-value read voltage (4)-(7). That is, this can be summarized as follows:

(i) the soft-value read voltages (4), (8), and (9) are set up to divide the threshold value distribution of data "00" at approximately regular intervals;

(ii) the soft-value read voltages (5), (10), and (11) are set up to divide the threshold value distribution of data "10" at approximately regular intervals;

(iii) the soft-value read voltages (6), (12), and (13) are set up to divide the threshold value distribution of data "00" at approximately regular intervals; and (iv) the soft-value read voltages (7), (14), and (15) are set up to divide threshold value distribution of data "11" at approximately regular intervals.

This is an example in case the threshold value distributions are made into approximately Gaussian distribution forms. The present invention is not limited to this example. Each of the threshold value distributions may be divided at slightly irregular or biased intervals, depending on the form of the threshold value distributions. Moreover, the number of divisions in each of the threshold value distributions, i.e., the number of the soft-value read voltages included in each of the threshold value distributions, is not limited to three. It may be four or more.

Next, the process of generating this soft-value data is explained in detail with reference to FIG. 15.

First, as shown in FIG. 12 and FIG. 13, word line voltage is set at the following (1) to (3) in this order:

(1) a plural-bit data read voltage VB;

(2) a plural-bit data read voltage VC; and (3) a plural-bit data read voltage VA.

Thereby, the lower page data Lower, the temporary upper page data Upper (prei), and the upper page data Upper are read.

Suppose that the word line voltage is changed in the order of (1), (2), ..., (15). The matrix of "1" and "0" indicated in the lower half of FIG. 15 indicates threshold voltages of the memory cell, page data obtained, and a soft-value (Soft-Value 1 (prei), Soft-Value 2 (prei), Soft-Value 1, Soft-Value 2), when the word line voltage is changed as described above.

Next, the word-line voltage is set at soft-value read voltages (4), (5), (6), (7) in this order (that is, the word-line voltage is lowered in a step-like manner from higher side to lower side). The soft value read voltages (4)-(7) each has an approximately intermediate value between an upper limit and an lower limit of each threshold value distribution.

First, when the soft-value read voltage (4) is set, soft-value data Soft-Value 1 (pre1) is read. This soft-value data Soft-Value 1 (pre1) is read out as data "0", only when memory cells with a threshold voltage larger than the right half of the threshold value distribution of data "00" is read. Otherwise, it is read out as data "1". This soft-value data Soft-Value 1 (pre1) is read and temporarily held at TDC, and held at DDCA via PDC.

Next, when the soft-value read voltage (5) is set, soft-value data Soft-Value 1 (pre2) is read. This soft-value data Soft-Value 1 (pre2) is read out as data "0", only when memory cells with a threshold voltage larger than the right half of the threshold value distribution of data "10" is read. Otherwise, it is read out as data "1", and is held at TDC. However, the soft-value data Soft-Value 1 (pre1) is held at DDCA. If the soft-value data Soft-Value 1 (pre1) held at DDCA is "0", the data held at TDC is forced to be inverted (reversed) to "1" (refer to the arrow in FIG. 15). That is, when the soft-value read voltage is lowered in a step-like manner, and neither a first soft-value read voltage nor a second soft-value read voltage smaller than the first soft-value read voltage by one step turns on the memory cell, the data obtained by the second soft-value read voltage is inverted. The inverted value is regarded as the soft-value.

Similarly, the soft-value read voltage (6) and (7) are applied as a word line voltage. When the previous Soft-Value 1 (prei) is "0", the data is inverted.

The data generated by the soft-value read voltage (7) is the Soft-Value 1. It is used for likelihood calculation in the likelihood calculation circuit 102 with the Soft-Value 2 described later.

Then, the word line voltage is set at soft-value read voltages (8) to (15) in this order (that is, the word-line voltage is lowered in a step-like manner from higher side to lower side). Data is inverted when the previous soft-value held at DDCA is "0", just like in the case of (4)-(7). The Soft-Value 2 generated by applying the soft-value read voltage (15) as a word-line voltage is used for likelihood calculation in the likelihood calculation circuit 102.

The Soft-Value 2 generated by applying the soft-value read voltage (15) as word line voltage is used in the likelihood calculation circuit 102 for likelihood calculation with the Soft-Value 1.

In the non-volatile semiconductor memory device according to this embodiment, in parallel with the execution of the soft-value generating process as described above, the first error correction circuit 101 may execute error detection and error correction. The error detection and correction are based on plural-bit data and redundant data obtained prior to the acquisition of the soft-values. When all of the errors have been corrected as a result of the error detection and correction in the first error correction circuit 101, the soft-values generated in parallel becomes unnecessary. Therefore, the soft-values are abandoned and the corrected data based on the first error correction circuit 101 is output from the output control circuit 104.

When judged that the error correction by the first error correction circuit 101 based on redundant data has ended up in failure, the second error correction circuit 103 starts the error correction based on the likelihood calculated in the likelihood calculation circuit 102 using the soft-values, as well as the plural-bit data and the redundant data. Improvement in a throughput of data transfer can be obtained by performing such a parallel processing.

The second error correction circuit 103 repeats correction in a try-and-error manner based on the calculated likelihood.

When it repeated the correction for predetermined times but the correction would not be completed, it may be judged that the correction has ended up in failure. In this case, the calculated likelihood is discarded. Then, the number of the soft-value read voltages is increased from 12 (above-mentioned (4)-(15)) to 16, for example. The newly-obtained soft-values are used to calculate likelihood in the likelihood calculation circuit 102. Thereby, the certainty of plural-bit data (likelihood) may be judged correctly, and a possibility that an error can be corrected becomes high. Thus, increasing the number of soft-value read voltages in a step-like manner is preferable from a viewpoint of maintaining the data-read speed of a non-volatile semiconductor memory device while eliminating data error.

Although the embodiment of the present invention has been explained, the present invention is not limited to this. Various modifications, additions and the like are possible without departing from the spirit of the present invention. For example, although the above-mentioned embodiment has explained 4-value data as plural-bit data as an example, it is needless to say that the present invention is not limited to this, and it is applicable to N-value data (N is one or more integers) such as 8 or 16.

Moreover, the error detection and correction of plural-page data making up plural-bit data may be independently performed based on the redundant data attached to each page, and may be performed integrally. In case of the latter, it is possible to prepare storage cells (shift register) in the data input-and-output buffer 4 according to the number of page data, make these storage cells to store the plural-page data respectively, and thereafter read the data.

Moreover, the threshold value voltage of a memory cell changes, as time elapses. Therefore threshold value distributions are also changed as shown in FIG. 16.

In this case, if the magnitude of the soft-value read voltages are unchanged (for example, voltages (4), (8), and (9) for data "00"), the soft-value read voltages will not divide threshold value distributions at a suitable interval. Therefore, there is a possibility that calculation of "certainty" based on the soft-values may not be performed correctly.

Figure 16:
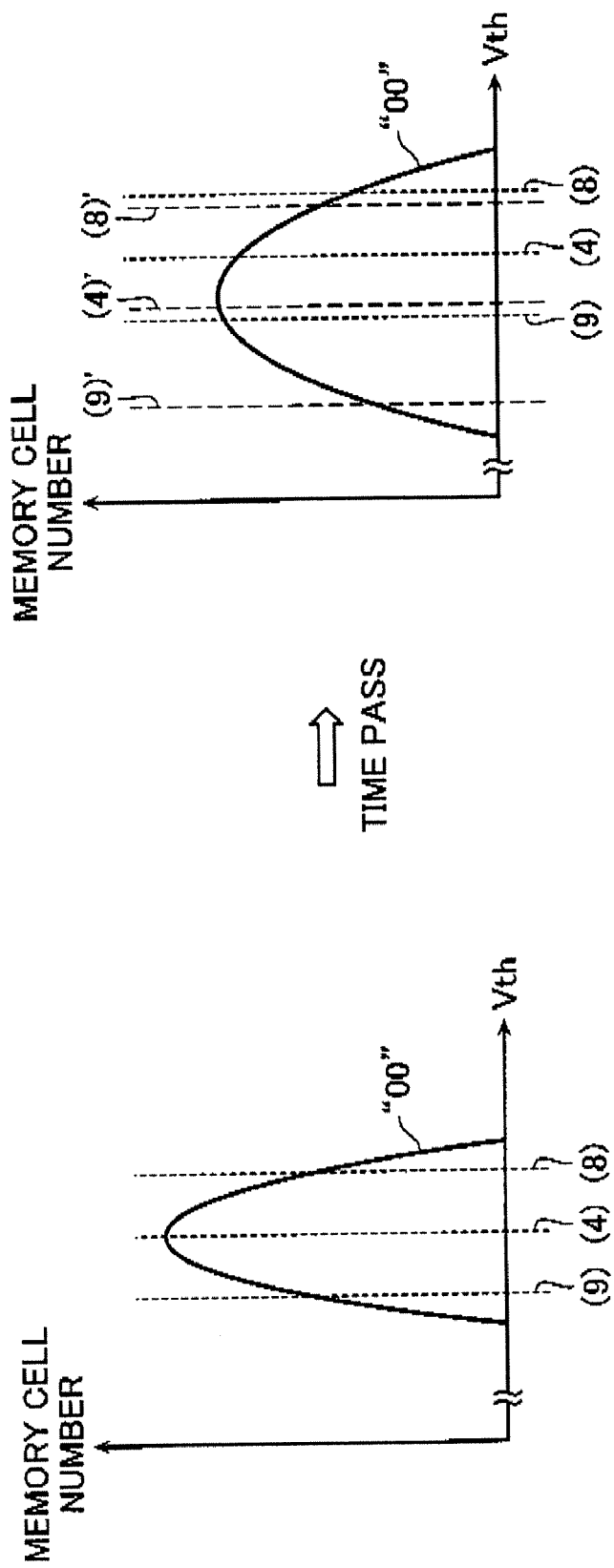
FIG. 16 shows a modified example of the embodiment.

Accordingly, as shown in FIG. 16, the soft-value read voltages (4), (8), (9) may be changed to (4)', (8)', (9)' to correspond to the change of the threshold value distributions. Thereby, it becomes possible to calculate the "certainty" based on soft-values much more correctly.

The amount of change of each soft-value read voltage in accordance with progress of time may be stored in a table. The table may stores values calculated in advance based on a simulation. It is preferable that the amount of change may be determined based on the value of this table.

Figure 17:
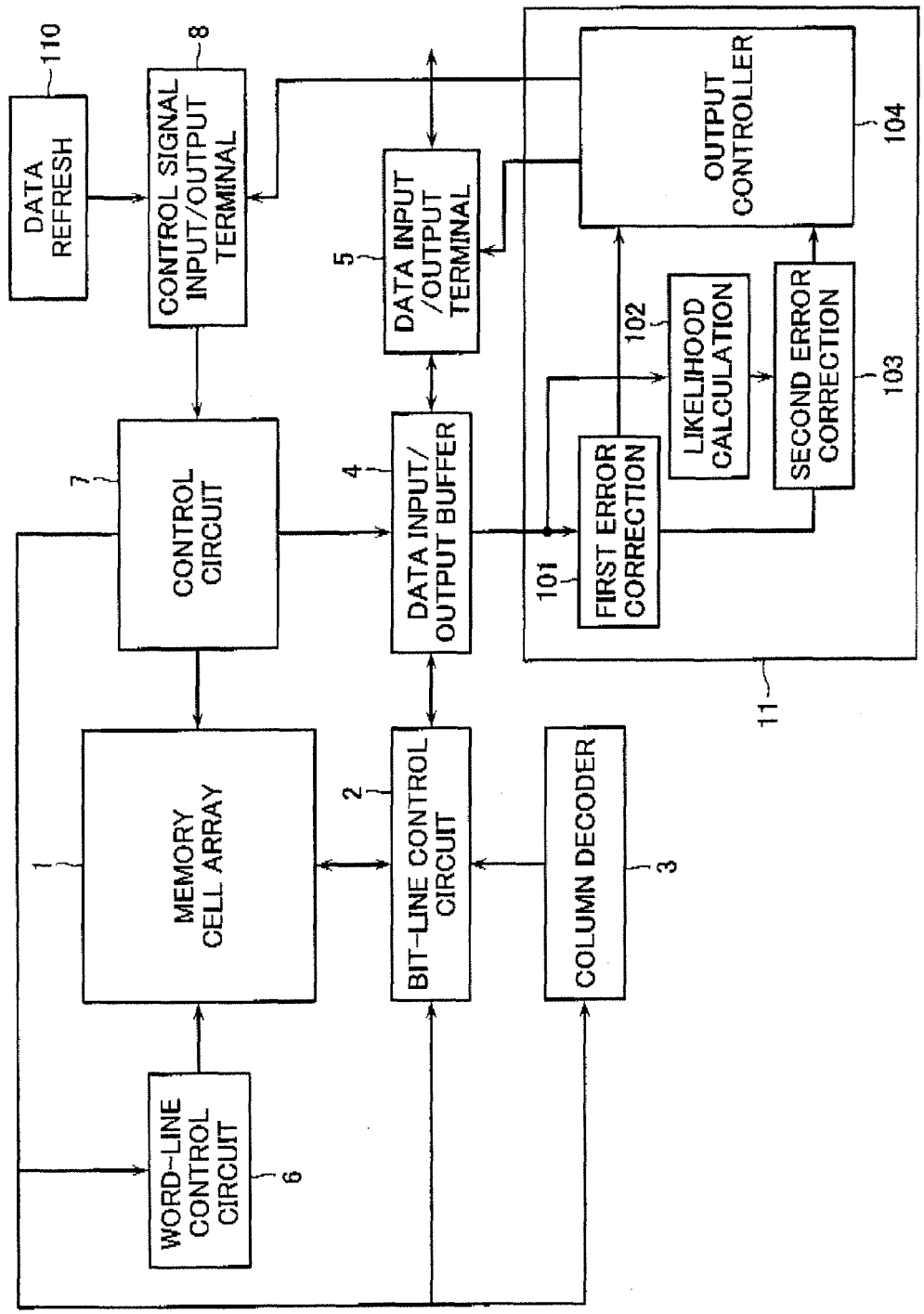
FIG. 17 shows a modified example of the embodiment.

Moreover, as shown in FIG. 17, in order to restrict change of such threshold voltages, it is also possible to provide a data refresh circuit 110 for rewriting data of a memory cell according to a command from a user or periodically, to reform the threshold value distributions deformed as shown in the right side of FIG. 16, as shown in the left side of FIG. 16.

Figure 18:
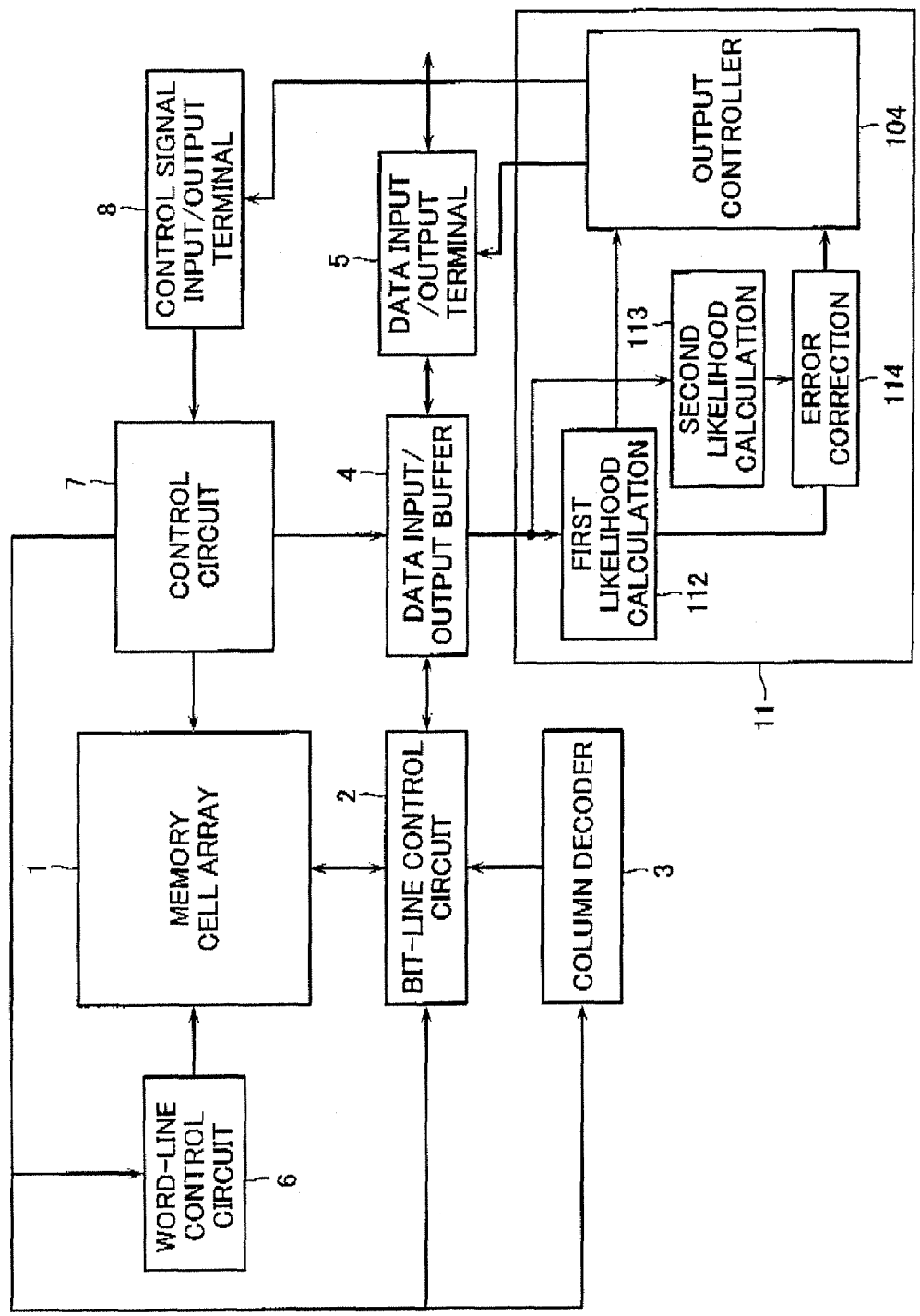
FIG. 18 shows a modified example of the embodiment.

Moreover, although the first error correction circuit 101 performing error correction of plural-bit data based on redundant data, and the second error correction circuit 103 performing error correction based on likelihood calculated based on the soft-value are formed in the above-mentioned embodiment, the present invention is not limited to this. FIG. 18 shows one of the modifications. This example is equipped with a first likelihood calculation circuit 112 which calculates the likelihood of plural-bit data based on plural-bit data and redundant data, and a second likelihood calculation circuit 113 which calculates the likelihood of plural-bit data based on soft-value. The likelihood calculation circuits 112 and 113 have a likelihood table (not shown) which associates and stores redundant data, soft-value data and a likelihood respectively, and can judge and output likelihood by referring to this.

The error correction circuit 114 performs error correction based on the likelihood calculated in the first likelihood calculation circuit 112, or the likelihood calculated in the second likelihood calculation circuit 113. Thus, since the likelihood of plural-bit data is calculated based on redundant data, it needs only one error correction circuit 114.

What is claimed is:

1. A non-volatile semiconductor storage system comprising:
    a memory cell array comprising a plurality of memory cells enabled to store multi-value data, the memory cells being arranged along a plurality of bit-lines and a plurality of word-lines;
    a bit-line control circuit connected to the bit-lines to control the bit-line;
    a word-line control circuit controlling applying a plural-bit data read voltage as a word line voltage to the word line, the plural-bit data read voltage being larger than an upper limit of one of plural threshold voltage distributions representing the plural-bit data and smaller than a lower limit of another threshold voltage distribution with higher threshold voltages than the one of the plural threshold voltage distributions, and applying a soft-value read voltage as a word line voltage to the word line, the soft-value read voltage being smaller than an upper limit of each of the plurality of the threshold voltage distributions and larger than a lower limit thereof to generate a plurality of soft-values; and
    a likelihood calculation circuit calculating a likelihood of plural-bit data stored in the memory cell based on the soft-value generated by setting the word-line voltage at the soft-value read voltage.

2. The non-volatile semiconductor storage system according to claim 1, further comprising an error correction circuit executing data error correction for the plural-bit data based on the likelihood.

3. The non-volatile semiconductor storage system according to claim 2, wherein the error correction circuit is enabled to execute error detection and error correction using the plural-bit data and redundant data while it reads the soft-value in parallel.

4. The non-volatile semiconductor storage system according to claim 2, wherein the error correction circuit is enabled to execute error correction using the plural-bit data held in the plurality of memory cells and redundant data, and when this is judged to have ended up in failure, configured to start error correction based on the likelihood calculated using the plural-bit data and the redundant data as well as the soft-value.

5. The non-volatile semiconductor storage system according to claim 3, wherein the redundant data is stored in the memory cell.

6. The non-volatile semiconductor storage system according to claim 1, wherein when all errors has been corrected by the error correction based on the redundant data, the error correction circuit is configured to output the data after the error correction.

7. The non-volatile semiconductor storage system according to claim 1, wherein when error correction based on the likelihood calculated using the soft-value is judged to have ended up in failure, the number of the soft-value read voltages is increased, and again the soft-values are obtained to calculate the likelihood by the likelihood calculation circuit.

8. The non-volatile semiconductor storage system according to claim 1, wherein the likelihood calculation circuit is configured to generate a first soft-value first by setting the soft-value read voltage at a first voltage having an approximately intermediate value of each of the threshold value distributions, and subsequently, generate a second soft-value by setting the soft-value read voltage at a second voltage having an value between the first voltage and an upper limit or a lower limit of the threshold value distribution, and calculate the likelihood based on the first and second soft-values, wherein the first and second soft-values are generated by lowering the first voltage or the second voltage in a step-like manner, and, based on a state of data read when the first voltage or the second voltage is set at a certain value, inverting data read when the first voltage or the second voltage is set at a value lower than the certain value by one step.

9. The non-volatile semiconductor storage system according to claim 8, wherein in case data read when the first voltage or the second voltage is set at the certain value coincides with data read when the first voltage or the second voltage is set at a value lower than the certain value by one step, the data is inverted and output as the first soft-value or the second soft-value.

10. The non-volatile semiconductor storage system according to claim 8, wherein when error correction based on the likelihood calculated using the soft-value is judged to have ended up in failure, the number of the second voltages is increased to newly obtain the soft-values and to calculate the likelihood by the likelihood calculation circuit.

11. The non-volatile semiconductor storage system according to claim 1, wherein the soft-value read voltage varies with time.

12. The non-volatile semiconductor storage system according to claim 1, further comprising a data refresh circuit executing rewriting of data in the memory cell to restrict change in threshold voltages of the memory cell with time.

13. The non-volatile semiconductor storage system according to claim 1, further comprising a first likelihood calculation circuit calculating likelihood of the plural-bit data based on the plural-bit data and the redundant data, and a second likelihood calculation circuit calculating likelihood of the plural-bit data based on the soft-values.

14. The non-volatile semiconductor storage system according to claim 1, further comprising an error correction circuit executing error correction based on either the likelihood calculated by the first likelihood calculation circuit, or the likelihood calculated by the second likelihood calculation circuit.

15. The non-volatile semiconductor storage system according to claim 1, further comprising:
a flag cell selected simultaneously with a plurality of the memory cells selected each of the word-lines and storing flag data indicating a writing situation of the multi-value data to the memory cells; and
a flag data storage circuit storing the flag data to be written in the flag cell.

16. The non-volatile semiconductor storage system according to claim 15, wherein the flag data is rewritten when the upper page compared to the first page has been written.

* * * * *